United States Patent
Hayashi

(10) Patent No.: US 10,842,011 B2
(45) Date of Patent: Nov. 17, 2020

(54) EXTREME ULTRAVIOLET LIGHT GENERATION SYSTEM

(71) Applicant: Gigaphoton Inc., Tochigi (JP)

(72) Inventor: Kengo Hayashi, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 16/598,051

(22) Filed: Oct. 10, 2019

(65) Prior Publication Data
US 2020/0045802 A1 Feb. 6, 2020

Related U.S. Application Data

(63) Continuation of application No. PCT/JP2017/020321, filed on May 31, 2017.

(51) Int. Cl.
*H05G 2/00* (2006.01)
*G03F 7/20* (2006.01)

(52) U.S. Cl.
CPC ......... *H05G 2/008* (2013.01); *G03F 7/70033* (2013.01)

(58) Field of Classification Search
CPC ........ H05G 2/001; H05G 2/003; H05G 2/005; H05G 2/006; H05G 2/008; G03F 7/70033
See application file for complete search history.

(56) References Cited

U.S. PATENT DOCUMENTS

| | | | |
|---|---|---|---|
| 6,278,516 B1 * | 8/2001 | Miwa ................. | G03F 7/70025 355/67 |
| 2005/0130453 A1 * | 6/2005 | Inada ................ | H01L 21/67276 438/800 |

FOREIGN PATENT DOCUMENTS

| | | | |
|---|---|---|---|
| JP | 05192783 A | * | 8/1993 |
| JP | H05-192783 A | | 8/1993 |
| JP | H11-186131 A | | 7/1999 |
| JP | 2000-349381 A | | 12/2000 |
| JP | 2005-175125 A | | 6/2005 |
| JP | 2009-188128 A | | 8/2009 |
| WO | 2011/074649 A1 | | 6/2011 |

OTHER PUBLICATIONS

International Search Report issued in PCT/JP2017/020321; dated Aug. 29, 2017.
Written Opinion issued in PCT/JP2017/020321; dated Aug. 29, 2017.

* cited by examiner

*Primary Examiner* — David E Smith
(74) *Attorney, Agent, or Firm* — Studebaker & Brackett PC

(57) ABSTRACT

An extreme ultraviolet light generation system includes: a first area including an optical path adjustment unit; a second area including a chamber having inside a plasma generating region; a first interlock switch disposed in the first area; a second interlock switch disposed in the second area; and a control unit capable of performing switching among a first setting state in which monitoring of a sensing signal output from the first interlock switch and a sensing signal output from the second interlock switch is activated, a second setting state in which monitoring of a sensing signal output from the first interlock switch and a sensing signal output from the second interlock switch is deactivated, and a third setting state in which monitoring of a sensing signal output from the first interlock switch is activated and monitoring of a sensing signal output from the second interlock switch is deactivated.

20 Claims, 7 Drawing Sheets

Fig. 5

| MODE | DEFEAT | | SIMPLIFIED DIAGRAM | EXEMPLARY WORK | LASER KIND | ITEM | | AREA 1 | | AREA 2 | | REMARKS |
| | AREA 1 | AREA 2 | | | | LIGHT SHIELD-ING UNIT | LIGHT DIM-MING UNIT | DOOR | OPTICAL PATH TUBE | HOUSING COVER | OPTICAL PATH TUBE | |
| --- | --- | --- | --- | --- | --- | --- | --- | --- | --- | --- | --- | --- |
| NORMAL (HIGH OUTPUT) | OFF | OFF | | - EUV LIGHT EMISSION<br>- PLASMA POINT OUTPUT MEASUREMENT<br>- LASER OUTPUT MEASUREMENT<br>- SPOT BARYCENTER POSITION/CONTROL CHARACTERISTIC ADJUSTMENT | $CO_2$ | Open | Remove | MONI-TORED | MONI-TORED | MONI-TORED | MONI-TORED | AMPLI-FIED |
| | | | | | PPL | Open | Remove | MONI-TORED | MONI-TORED | MONI-TORED | MONI-TORED | AMPLI-FIED |
| LIGHT DIM-MING | ON | ON | | - LASER BEAM OPTICAL AXIS (TO CHAMBER) ADJUSTMENT | $CO_2$ | Open | Set | DE-FEATED | DE-FEATED | DE-FEATED | DE-FEATED | NOT AMPLI-FIED |
| | | | | | PPL | Open | Set | DE-FEATED | DE-FEATED | DE-FEATED | DE-FEATED | AMPLI-FIED |
| LIGHT SHIELD-ING | OFF | ON | | - AREA 1: LASER OUTPUT MEASUREMENT<br>- AREA 2: CHAMBER MAINTENANCE | $CO_2$ | Close | Remove | MONI-TORED | MONI-TORED | DE-FEATED | DE-FEATED | AMPLI-FIED |
| | | | | | PPL | Close | Remove | MONI-TORED | MONI-TORED | DE-FEATED | DE-FEATED | AMPLI-FIED |
| LIGHT DIM-MING AND SHIELD-ING | ON | ON | | - AREA 1: LASER OPTICAL AXIS ADJUSTMENT<br>- AREA 2: CHAMBER MAINTENANCE (DLG REPLACEMENT, CLEANING, REPLACEMENT OF OPTICAL ELEMENT SUCH AS MIRROR) | $CO_2$ | Close | Set | DE-FEATED | DE-FEATED | DE-FEATED | DE-FEATED | NOT AMPLI-FIED |
| | | | | | PPL | Close | Set | DE-FEATED | DE-FEATED | DE-FEATED | DE-FEATED | AMPLI-FIED |

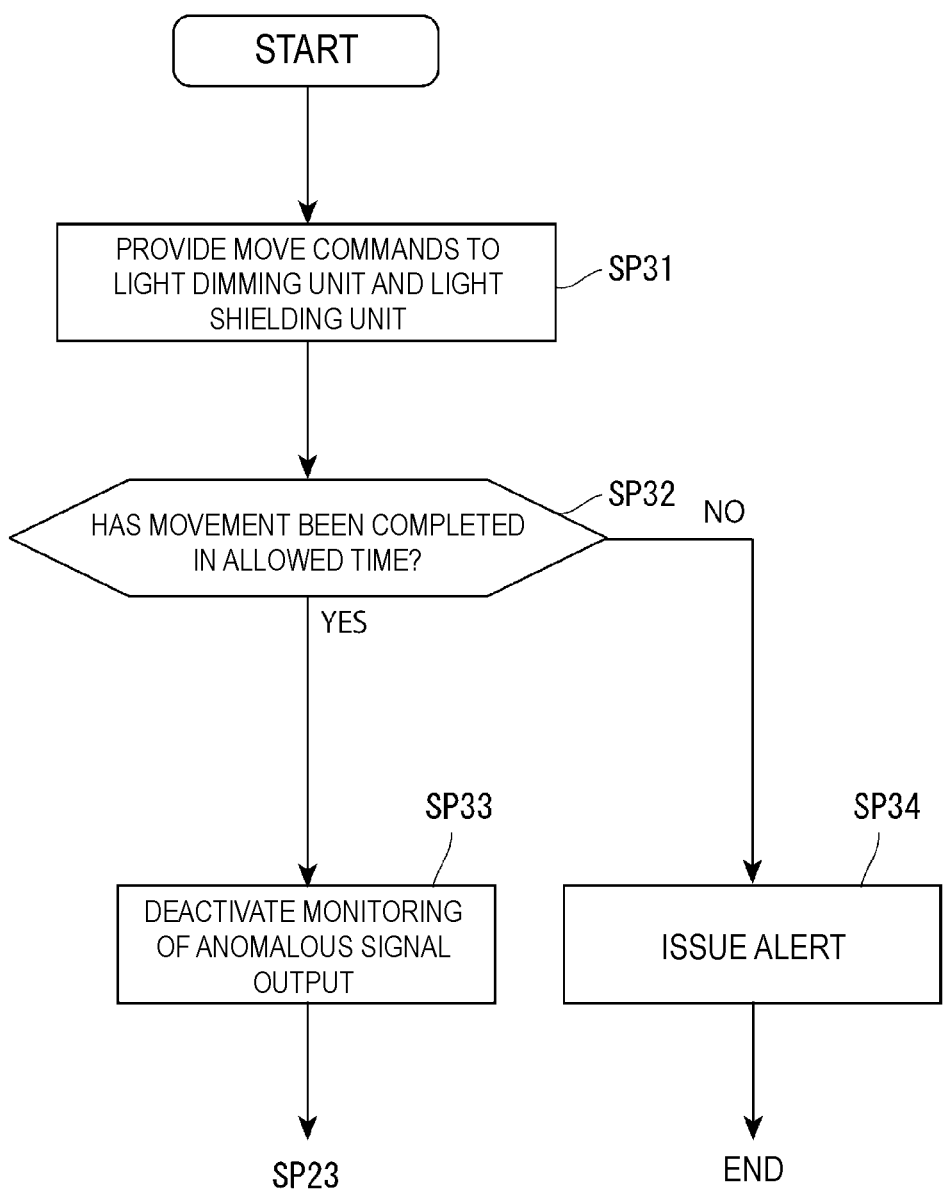

EXTREME ULTRAVIOLET LIGHT GENERATION SYSTEM

CROSS-REFERENCE TO RELATED APPLICATIONS

The present application is a continuation application of International Application No. PCT/JP2017/020321 filed on May 31, 2017. The content of the application is incorporated herein by reference in its entirety.

BACKGROUND

1. Technical Field

The present disclosure relates to an extreme ultraviolet light generation system.

2. Related Art

Recently, miniaturization of a transfer pattern in optical lithography of a semiconductor process has been rapidly proceeding along with miniaturization of the semiconductor process. Minute fabrication at 20 nm or smaller will be requested in the next generation technology. To meet the request for minute fabrication at 20 nm or smaller, for example, it is desired to develop an exposure device including an extreme ultraviolet light generation device configured to generate extreme ultraviolet (EUV) light at a wavelength of 13 nm approximately in combination with reduced projection reflective optics.

Disclosed EUV light generation devices include the three kinds of devices of a laser produced plasma (LPP) device that uses plasma generated by irradiating a target material with a pulse laser beam, a discharge produced plasma (DPP) device that uses plasma generated by electrical discharge, and a synchrotron radiation (SR) device that uses synchrotron radiation.

LIST OF DOCUMENTS

Patent Documents

Patent Document 1: Japanese Unexamined Patent Application Publication No. 11-186131
Patent Document 2: Japanese Unexamined Patent Application Publication No. 05-192783
Patent Document 3: Japanese Unexamined Patent Application Publication No. 2009-188128
Patent Document 4: Japanese Unexamined Patent Application Publication No. 2000-349381

SUMMARY

An extreme ultraviolet light generation system according to an aspect of the present disclosure may include: a first area including an optical path adjustment unit configured to adjust an optical path of a laser beam emitted from an oscillator; a second area including a chamber having inside a plasma generating region in which extreme ultraviolet light is generated from plasma of a target substance irradiated with the laser beam; a first interlock switch disposed in the first area and configured to sense the state of a sensing object in the first area; a second interlock switch disposed in the second area and configured to sense the state of a sensing object in the second area; and a control unit capable of performing switching among a first setting state in which monitoring of a sensing signal output from the first interlock switch and monitoring of a sensing signal output from the second interlock switch are both activated, a second setting state in which monitoring of a sensing signal output from the first interlock switch and monitoring of a sensing signal output from the second interlock switch are both deactivated, and a third setting state in which monitoring of a sensing signal output from the first interlock switch is activated and monitoring of a sensing signal output from the second interlock switch is deactivated.

BRIEF DESCRIPTION OF THE DRAWINGS

Embodiments of the present disclosure will be described below as examples with reference to the accompanying drawings.

FIG. 5 is a table listing various mode states, exemplary maintenance work, and the like in the extreme ultraviolet light generation system.

FIG. 6 is a flowchart illustrating a setting processing routine.

DESCRIPTION OF EMBODIMENTS

1. Overview
2. Extreme ultraviolet light generation system
  2.1 Overall configuration
  2.2 Operation
3. Extreme ultraviolet light generation system of comparative example
  3.1 Configuration
  3.2 Operation
  3.3 Problem
4. Extreme ultraviolet light generation system of embodiment
  4.1 Configuration
  4.2 Operation
  4.3 Effect Embodiments of the present disclosure will be described below in detail with reference to the accompanying drawings.

The embodiments described below are examples of the present disclosure, and do not limit the contents of the present disclosure. Not all configurations and operations described in each embodiment are necessarily essential as configurations and operations of the present disclosure.

Components identical to each other are denoted by an identical reference sign, and duplicate description thereof will be omitted.

1. Overview

An embodiment of the present disclosure relates to an extreme ultraviolet light generation device configured to generate extreme ultraviolet light and a laser apparatus used to generate the extreme ultraviolet light. In the present specification, extreme ultraviolet light is also referred to as EUV light.

2. Extreme Ultraviolet Light Generation System

2.1 Overall Configuration

Figure 1:
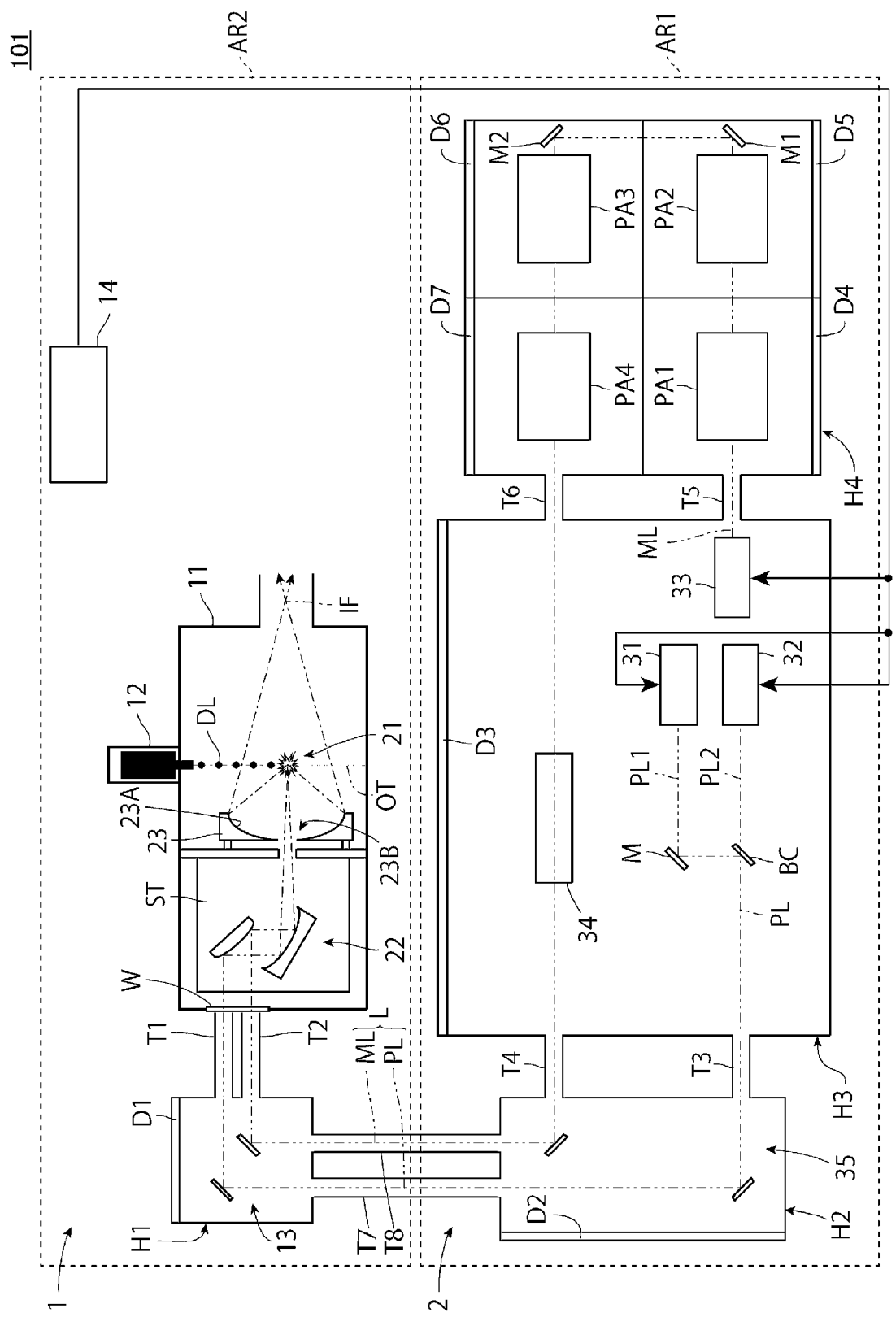
FIG. 1 is a pattern diagram illustrating an exemplary entire schematic configuration of an extreme ultraviolet light generation system.

FIG. 1 is a pattern diagram illustrating an exemplary entire schematic configuration of an extreme ultraviolet light generation system. As illustrated in FIG. 1, this extreme ultraviolet light generation system 101 includes an extreme ultraviolet light generation device 1 and a laser apparatus 2. The extreme ultraviolet light generation device 1 is disposed in a second area AR2, and the laser apparatus 2 is disposed in a first area AR1. The second area AR2 may be a clean room, and the first area AR1 may be a sub fabrication room of the clean room. The first area AR1 and the second area AR2 may be rooms different from each other on the same floor.

The extreme ultraviolet light generation device 1 includes a chamber 11 and a droplet supply unit 12. The chamber 11 is a sealable container that can be depressurized. The droplet supply unit 12 supplies a droplet DL of a target substance into the chamber 11. For example, the droplet supply unit 12 may supply the droplets DL of the target substance into the chamber 11 at intervals by a continuous jet scheme. The material of the target substance may contain tin, terbium, gadolinium, lithium, xenon, or a combination of two or more thereof, but is not limited thereto.

The wall of the chamber 11 is provided with at least one through-hole. The through-hole is blocked by a window W through which a laser beam L is incident in the chamber 11. The laser beam L may include a laser beam PL emitted from a pre-pulse laser unit and a laser beam ML emitted from a master oscillator, or may only include the laser beam ML emitted from the master oscillator. In the example illustrated in FIG. 1, the laser beam L includes the laser beam PL emitted from the pre-pulse laser unit and the laser beam ML emitted from the master oscillator.

A plasma generating region 21 is a part of a trajectory OT of each droplet DL supplied from the droplet supply unit 12 inside the chamber 11. Plasma is generated from the droplet DL in the plasma generating region 21. The laser beam L incident in the chamber 11 through the window W is condensed onto the plasma generating region 21 through a laser condensation optical system 22.

For example, the laser condensation optical system 22 may include a convex mirror that reflects and spreads the laser beam L incident in the chamber 11, and a concave mirror that reflects and guides the spread laser beam L to the plasma generating region 21 through condensation. The laser condensation optical system 22 may be disposed on a stage ST movable in three axial directions, and the stage ST may be controlled so that the focusing position of the laser condensation optical system 22 is located at a target position.

An EUV light focusing mirror 23 is provided inside the chamber 11. The EUV light focusing mirror 23 condenses EUV light generated from plasma of the droplet in the plasma generating region 21. The EUV light focusing mirror 23 may include, for example, a spheroidal reflection surface 23A that reflects the EUV light generated in the plasma generating region 21, and may have a first focal point positioned in the plasma generating region 21 and a second focal point positioned at an intermediate focus point IF. The EUV light focusing mirror 23 may include a through-hole 23B about the central axis of the EUV light focusing mirror 23 so that the laser beam L incident in the chamber 11 passes through the through-hole 23B. The EUV light focusing mirror 23 may be provided with a temperature adjuster configured to maintain the temperature of the EUV light focusing mirror 23 substantially constant. The central axis of the EUV light focusing mirror 23 may be a straight line passing through the first and second focal points of the reflection surface 23A, and may be the rotational axis of the spheroidal surface.

The extreme ultraviolet light generation device 1 further includes a beam transmission optical system 13. The beam transmission optical system 13 transmits, to the chamber 11, the laser beam L incident in the second area AR2 from the first area AR1. As described above, the laser beam L includes the laser beam PL and the laser beam ML. For example, the beam transmission optical system 13 may include a mirror that reflects the laser beam PL included in the laser beam L, and a mirror that reflects the laser beam ML included in the laser beam L. In the example illustrated in FIG. 1, the number of mirrors is two, but may be any plural number.

The extreme ultraviolet light generation device 1 further includes a control unit 14. The control unit 14 is a computer or a programmable logic controller (PLC) including a central processing unit (CPU) and the like, and executes various kinds of control. For example, the control unit 14 drives the laser apparatus 2 in burst operation. In the burst operation, the laser beam L is emitted as continuous pulses at a predetermined repetition frequency in a burst duration, and the emission of the laser beam L is not performed in a burst stop duration. For example, the burst duration and the burst stop duration are alternately repeated. These various kinds of control by the control unit 14 are merely exemplary, and may include other control as necessary.

The laser apparatus 2 includes a first pre-pulse laser unit 31 and a second pre-pulse laser unit 32. The first pre-pulse laser unit 31 and the second pre-pulse laser unit 32 may be the same pulse laser unit or different pulse laser units. Such a pulse laser unit is, for example, a solid-state laser or a gas laser. Examples of the solid-state laser include a Nd:YAG laser, a Nd:YVO4 laser, and a laser configured to emit harmonic light thereof. Examples of the gas laser include a $CO_2$ laser and an excimer laser.

The laser apparatus 2 further includes a mirror M and a beam combiner BC. The mirror M reflects, toward the beam combiner BC, a laser beam PL1 emitted from the first pre-pulse laser unit 31. The beam combiner BC substantially aligns the optical path of the laser beam PL1 reflected by the mirror M and the optical path of a laser beam PL2 emitted from the second pre-pulse laser unit 32. The beam combiner BC is configured by, for example, a polarization beam splitter.

The laser apparatus 2 also includes a master oscillator 33. The master oscillator 33 emits the laser beam L in pulses. The master oscillator 33 emits the laser beam by exciting gas as a mixture of, for example, helium or nitrogen and carbon dioxide gas through electrical discharge. Alternatively, the master oscillator 33 may be a quantum cascade laser oscillator.

The laser apparatus 2 further includes a plurality of power amplifiers PA1 to PA4. The power amplifiers PA1 to PA4 are each disposed on the optical path of the laser beam ML. In the example illustrated in FIG. 1, a mirror M1 and a mirror M2 are disposed on the optical path of the laser beam ML between the power amplifier PA3 and the power amplifier PA4. The power amplifiers PA1 to PA4 each amplify the power of the incident laser beam ML. For example, the power amplifiers PA1 to PA4 may be each configured by a regenerative power amplifier. The power amplifiers PA1 to PA4 may have the same configuration or different configurations. The number of power amplifiers is four in the present example but may be one or any plural number other than four.

The laser apparatus 2 also includes an optical path adjustment unit 34 and a beam transmission optical system 35. The optical path adjustment unit 34 adjusts the optical path of the laser beam ML in the plasma generating region 21. For example, the optical path adjustment unit 34 may include a plurality of mirrors disposed on the optical path of the laser beam ML, a detection unit configured to detect information such as the position and angle of the laser beam ML incident in the plasma generating region 21, and a control unit configured to individually control the mirrors. The control unit can control at least one of the mirrors based on the information detected by the detection unit to adjust the optical path of the laser beam ML so that the laser beam L is incident at a target position in the plasma generating region 21. The control unit 14 may perform the above-described control of the control unit.

The beam transmission optical system 35 transmits, to the second area AR2, the laser beam PL emitted from the beam combiner BC and the laser beam ML emitted from the optical path adjustment unit 34. Similarly to the beam transmission optical system 13, the beam transmission optical system 35 may be configured by, for example, a mirror that reflects the laser beam PL and a mirror that reflects the laser beam ML. The laser beam PL includes the laser beam PL1 emitted from the first pre-pulse laser unit 31 and the laser beam PL2 emitted from the second pre-pulse laser unit 32. In the example illustrated in FIG. 1, the number of mirrors is two but may be any plural number.

The extreme ultraviolet light generation system 101 includes a plurality of housings H1 to H4 and a plurality of optical path tubes T1 to T8 in addition to the above-described configuration.

The inside of each of the housings H1 to H4 and the optical path tubes T1 to T8 may be vacuum, or dry air, inert gas, or the like may be introduced to the inside. When dry air, inert gas, or the like is introduced, the gas may have low pressure close to vacuum.

The housing H1 is disposed in the second area AR2 and provided with one door D1. The housing H1 houses the beam transmission optical system 13. The housings H2 to H4 are disposed in the first area AR1. The housing H2 is provided with one door D2 and houses the beam transmission optical system 35. The housing H3 is provided with one door D3 and houses the first pre-pulse laser unit 31, the second pre-pulse laser unit 32, the master oscillator 33, and the optical path adjustment unit 34. The housing H4 is provided with four doors D4 to D7 and houses the power amplifiers PA1 to PA4. The number of doors provided to each of the housings H1 to H4 may be any number equal to or larger than one and different from the above-described numbers of doors.

The optical path tubes T1 to T8 are detachably provided at predetermined attachment positions in the housings H1 to H4. The optical path tube T1 and the optical path tube T2 are disposed between the housing H1 and the window W of the chamber 11. The optical path tubes T1 and T2 are each attached while one end thereof is communicated with the housing H1 and the other end contacts the window W. The optical path tubes T3 and T4 are each communicated with the housings H2 and H3, and the optical path tubes T5 and T6 are each communicated with the housings H3 and H4. The optical path tubes T7 and T8 are each disposed across the first area AR1 and the second area AR2 and communicated with the housing H1 in the first area AR1 and the housing H2 in the second area AR2.

2.2 Operation

When having received a drive command from, for example, an operation input unit, the control unit 14 of the extreme ultraviolet light generation device 1 drives each of the power amplifiers PA1 to PA4. In addition, when having received the drive command, the control unit 14 generates a first light emission trigger signal, a second light emission trigger signal delayed from the first light emission trigger signal by a predetermined time, and a third light emission trigger signal delayed from the second light emission trigger signal by a predetermined time. Then, the control unit 14 outputs the generated first light emission trigger signal to the first pre-pulse laser unit 31, outputs the generated second light emission trigger signal to the second pre-pulse laser unit 32, and outputs the generated third light emission trigger signal to the master oscillator 33.

The first pre-pulse laser unit 31 starts the burst operation based on the first light emission trigger signal, and emits the laser beam PL1 in the burst duration. The second pre-pulse laser unit 32 starts the burst operation based on the second light emission trigger signal, and emits the laser beam PL2 in the burst duration. The master oscillator 33 starts the burst operation based on the third light emission trigger signal, and emits the laser beam ML in the burst duration.

As described above, the first light emission trigger signal, the second light emission trigger signal, and the third light emission trigger signal are output from the control unit 14 at timings different from each other. Thus, at least peaks of pulses of the laser beam PL1, the laser beam PL2, and the laser beam ML do not coincide with each other in the burst duration repeated in a predetermined period.

The laser beam PL1 emitted from the first pre-pulse laser unit 31 is reflected by the mirror M and incident on the beam combiner BC, and the laser beam PL2 emitted from the second pre-pulse laser unit 32 is incident on the beam combiner BC. The optical paths of the laser beams PL1 and PL2 incident on the beam combiner BC are substantially aligned by the beam combiner BC. The laser beam PL including the laser beams PL1 and PL2 emitted from the beam combiner BC travels from the housing H3 to the housing H2 through the optical path tube T3, and is incident on the beam transmission optical system 35 in the housing H2.

The laser beam ML emitted from the master oscillator 33 travels from the housing H3 to the housing H4 through the optical path tube T5, and is amplified by the power amplifiers PA1 to PA4 in the housing H4. The laser beam ML amplified by the power amplifier PA4 travels from the housing H4 to the housing H3 through the optical path tube T6, and is incident on the optical path adjustment unit 34 in the housing H3. The laser beam ML emitted from the optical path adjustment unit 34 travels from the housing H3 to the housing H2 through the optical path tube 14, and is incident on the beam transmission optical system 35 in the housing H2.

The laser beam L including the laser beams PL and ML emitted from the beam transmission optical system 35 is output from the laser apparatus 2 in the first area AR1 and input to the extreme ultraviolet light generation device 1 disposed in the second area AR2 through the optical path tubes T7 and T8.

The laser beam L input to the extreme ultraviolet light generation device 1 is transmitted toward the optical path tubes T1 and T2 through the beam transmission optical system 13, and travels to the window W of the chamber 11 through the optical path tubes T1 and T2. The laser beam L incident in the chamber 11 through the window W of the chamber 11 is condensed in the plasma generating region 21 through the laser condensation optical system 22, and incident on at least one droplet DL supplied from the droplet supply unit 12.

The droplet DL becomes a secondary target being dispersed as smaller droplets through irradiation with the laser beam PL1 included in the laser beam L. The secondary target becomes a tertiary target being dispersed as smaller fine particles through irradiation with the laser beam PL2 included in the laser beam L. The tertiary target generates plasma through irradiation with the laser beam ML included in the laser beam L, and light including EUV light is radiated from the plasma. The EUV light is selectively reflected by the reflection surface of the EUV light focusing mirror 23 and condensed at the intermediate focus point IF. The EUV light condensed at the intermediate focus point IF is diffused and output to an exposure apparatus (not illustrated) connected with the chamber 11.

3. Extreme Ultraviolet Light Generation System of Comparative Example

The following describes an extreme ultraviolet light generation system of a comparative example. Any component identical to that in the above description is denoted by an identical reference sign, and duplicate description thereof will be omitted unless otherwise stated.

3.1 Configuration

Figure 2:
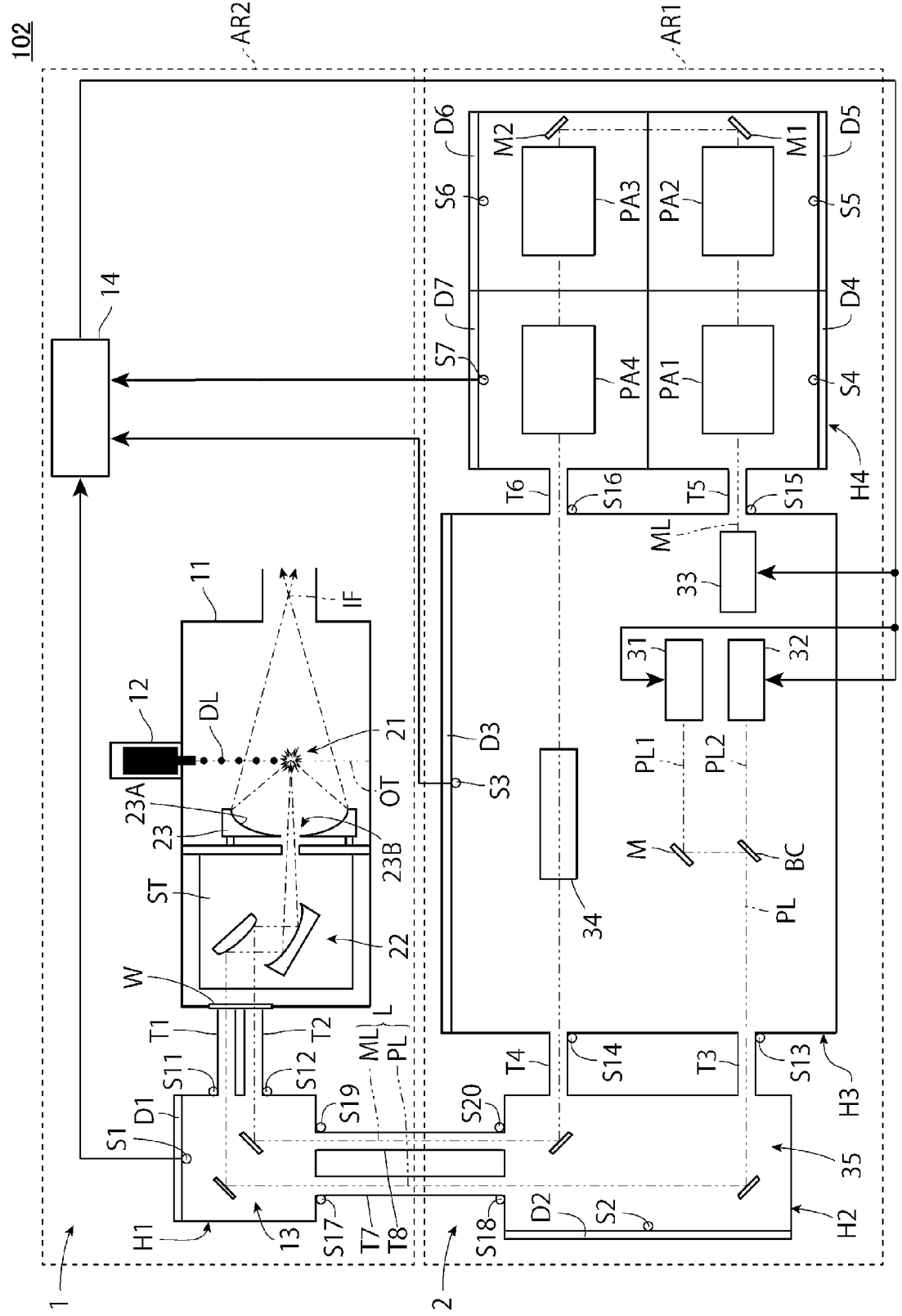
FIG. 2 is a pattern diagram illustrating an exemplary entire schematic configuration of an extreme ultraviolet light generation system of a comparative example.

FIG. 2 is a pattern diagram illustrating the configuration of the extreme ultraviolet light generation system of the comparative example. As illustrated in FIG. 2, this extreme ultraviolet light generation system 102 of the comparative example includes a plurality of interlock switches S1 to S7 configured to sense opening of doors in addition to the configuration of the extreme ultraviolet light generation system 101 described above.

The interlock switches S1 to S7 and the doors D1 to D7 have one-to-one relations, respectively. The interlock switches S1 to S7 are each provided to the corresponding one of the doors D1 to D7 and electrically connected with the control unit 14. For simplification of illustration, FIG. 2 only illustrates a signal line connecting each of the interlock switches S1, S3, and S7 and the control unit 14, but omits a signal line connecting each of the other interlock switches S2 and S4 to S6 and the control unit 14. The interlock switches S1 to S7 have identical configurations, and thus only the configuration of the interlock switch S1 will be described below.

The interlock switch S1 is in a normal contact point state when the door D1 is closed, or in an anomalous contact point state when the door D1 is opened. For example, the normal contact point state is a state in which a fixed contact piece provided to a frame member of the door D1 contacts a movable contact piece provided to the door D1, and the anomalous contact point state is a state in which the fixed contact piece does not contact the movable contact piece. Alternatively, the normal contact point state may be a state in which the fixed contact piece does not contact the movable contact piece, and the anomalous contact point state may be a state in which the fixed contact piece contacts the movable contact piece. The number of contact points of the interlock switch S1 may be equal to or larger than two. The interlock switch S1 outputs a sensing signal to the control unit 14 when the duration of the anomalous contact point state exceeds a predetermined duration. When the number of contact points is equal to or larger than two, the interlock switch S1 outputs the sensing signal to the control unit 14, for example, when the duration of the anomalous contact point state of each contact point exceeds the predetermined duration.

The extreme ultraviolet light generation system 102 of the comparative example also includes a plurality of interlock switches S11 to S20 each configured to sense dismantlement of an optical path tube in addition to the configuration of the extreme ultraviolet light generation system 101 described above.

The interlock switches S11 to S16 and the optical path tubes T1 to T6 have one-to-one relations, respectively. The interlock switches S11 to S16 are each provided to the corresponding one of the optical path tubes T1 to T6 and electrically connected with the control unit 14. For simplification of illustration, FIG. 2 omits a signal line connecting each of the interlock switches S11 to S16 and the control unit 14. The interlock switches S11 to S16 have identical configurations, and thus only the configuration of the interlock switch S11 will be described below.

The interlock switch S11 is in a normal contact point state when the optical path tube T1 is attached to a fixed position, or in an anomalous contact point state when the optical path tube T1 is off the fixed position. For example, the normal contact point state is a state in which a fixed contact piece provided to the housing H1 contacts a movable contact piece provided to the optical path tube T1, and the anomalous contact point state is a state in which the fixed contact piece does not contact the movable contact piece. Alternatively, the normal contact point state may be a state in which the fixed contact piece does not contact the movable contact piece, and the anomalous contact point state may be a state in which the fixed contact piece contacts the movable contact piece. The number of contact points of the interlock switch S11 may be equal to or larger than two. The interlock switch S11 outputs a sensing signal to the control unit 14 when the duration of the anomalous contact point state exceeds a predetermined duration. When the number of contact points is equal to or larger than two, the interlock switch S11 outputs the sensing signal to the control unit 14, for example, when the duration of the anomalous contact point state of each contact point exceeds the predetermined duration.

The optical path tubes T7 and T8 are each disposed across the first area AR1 and the second area AR2 as described above. Accordingly, the interlock switch S17 is provided on the first area AR1 side on the optical path tube T7, and the interlock switch S18 is provided on the second area AR2 side on the optical path tube T7. Similarly, the interlock switch S19 is provided on the first area AR1 side on the optical path tube T8, and the interlock switch S20 is provided on the second area AR2 side on the optical path tube T8. The interlock switches S17 to S20 are each electrically connected with the control unit 14. For simplification of illustration, FIG. 2 omits a signal line connecting each of the interlock switches S17 to S20 and the control unit 14. The configurations of the interlock switches S17 to S20 are same as the configuration of the interlock switch S11, and thus description thereof is omitted.

The control unit 14 of the extreme ultraviolet light generation system 102 of the comparative example drives the laser apparatus 2 in burst operation, and additionally monitors outputting of the sensing signal from each of the interlock switches S1 to S7 and S11 to S20.

3.2 Operation

When having received a drive command from, for example, the operation input unit, the control unit 14 in the extreme ultraviolet light generation system 102 of the comparative example drives each of the power amplifiers PA1 to PA4. In addition, the control unit 14 drives each of the first pre-pulse laser unit 31, the second pre-pulse laser unit 32, and the master oscillator 33.

When having received the drive command from, for example, the operation input unit, the control unit 14 continuously or periodically monitors outputting of the sensing signals from the interlock switches S1 to S7 provided to the doors D1 to D7 and from the interlock switches S11 to S20 provided to the optical path tubes T1 to T8. When no sensing signals are output from the interlock switches S1 to S7 and S11 to S20, all doors D1 to D7 are closed and all optical path tubes T1 to T8 are disposed at the fixed positions, and thus a safe operational state is maintained.

When having sensed opening of the corresponding one of the doors D1 to D7, the interlock switches S1 to S7 each output the sensing signal to the control unit 14. When having sensed dismantlement of the corresponding one of the optical path tubes T1 to T6, the interlock switches S11 to S16 each output the sensing signal to the control unit 14. When having sensed dismantlement of the optical path tubes T7 and T8 on the first area AR1 side, the interlock switches S17 and S19 each output the sensing signal to the control unit 14. When having sensed dismantlement of the optical path tubes T7 and T8 on the second area AR2 side, the interlock switches S18 and S20 each output the sensing signal to the control unit 14.

The control unit 14 stops the first pre-pulse laser unit 31, the second pre-pulse laser unit 32, and the master oscillator 33 upon detection of outputting of the sensing signal from one or more of the interlock switches S1 to S7 and S11 to S20.

3.3 Problem

In the extreme ultraviolet light generation system 102 of the comparative example, the control unit 14 stops the first pre-pulse laser unit 31, the second pre-pulse laser unit 32, and the master oscillator 33 of the laser apparatus 2 when at least one door is opened or at least one optical path tube is dismantled.

Thus, in the extreme ultraviolet light generation system 102 of the comparative example, a door opening operation and an optical path tube dismantling operation as prohibited operations cannot be performed while the first pre-pulse laser unit 31, the second pre-pulse laser unit 32, and the master oscillator 33 are driven. Thus, work such as maintenance is limited to a kind of work that can be performed without the prohibited operations, such as measurement of the power of the laser beam L incident in the chamber 11 by using a measurement instrument provided on, for example, the wall of the chamber 11. When the kind of work is limited, the operation availability of the extreme ultraviolet light generation device 1 or the laser apparatus 2 potentially decreases. Thus, the capability of performing more various kinds of work is requested.

The embodiment below exemplarily describes an extreme ultraviolet light generation system capable of performing more various kinds of work.

4. Extreme Ultraviolet Light Generation System of Embodiment 4.1 Configuration

Figure 3:
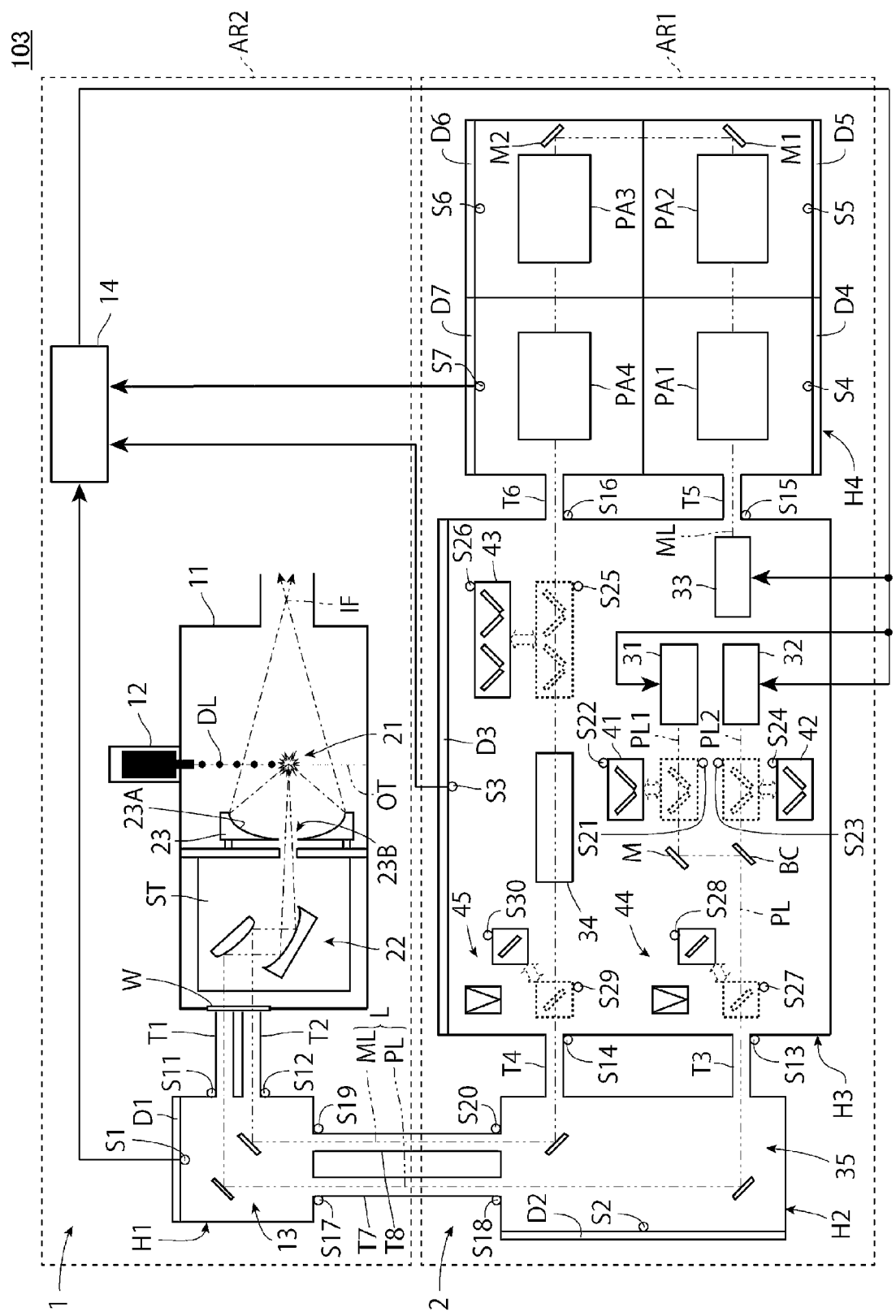
FIG. 3 is a pattern diagram illustrating an exemplary entire schematic configuration of an extreme ultraviolet light generation system according to an embodiment.

FIG. 3 is a pattern diagram illustrating the configuration of the extreme ultraviolet light generation system of the embodiment. As illustrated in FIG. 3, this extreme ultraviolet light generation system 103 of the embodiment further includes a plurality of light dimming units 41 to 43 in addition to the configuration of the extreme ultraviolet light generation system 102 of the comparative example.

The light dimming units 41 to 43 are each movable to a "set" position on a predetermined optical path in the first area AR1 and to a "remove" position off the optical path, and dims the power of light propagating on the optical path when located at the "set" position. In FIG. 3, the "set" position is illustrated with a dashed line, and the "remove" position is illustrated with a solid line. The light dimming units 41 to 43 may be each configured by, for example, a stage movable to the "set" position and the "remove" position in accordance with a command from the control unit 14, and an attenuator disposed on the stage. The stage may be moved by an air cylinder or by energization. The stage may automatically move to the "set" position at failure such as air leakage or breaking. The attenuator may be configured by, for example, an even number of beam splitters disposed so that the incident angle of light is opposite between the beam splitters. In the example illustrated in FIG. 3, two pairs of beam splitters are disposed on the stage.

The "set" position of the light dimming unit 41 in the present embodiment is closer to the first pre-pulse laser unit 31 as the oscillation source of the laser beam PL1 than the mirror M on the optical path of the laser beam PL1. Thus, at the "set" position, the light dimming unit 41 can dim the power of the laser beam PL1 emitted from the first pre-pulse laser unit 31. The "set" position of the light dimming unit 42 in the present embodiment is closer to the second pre-pulse laser unit 32 as the oscillation source of the laser beam PL2 than the beam combiner BC on the optical path of the laser beam PL2. Thus, at the "set" position, the light dimming unit 42 can dim the power of the laser beam PL2 emitted from the second pre-pulse laser unit 32. The "set" position of the light dimming unit 43 in the present embodiment is closer to the master oscillator 33 as the oscillation source of the laser beam ML than the optical path adjustment unit 34 on the optical path of the laser beam ML. Thus, at the "set" position, the light dimming unit 43 can dim the power of the laser beam ML emitted from the master oscillator 33.

The extreme ultraviolet light generation system 103 of the embodiment further includes a plurality of light shielding units 44 and 45 in addition to the configuration of the extreme ultraviolet light generation system 102 of the comparative example.

The light shielding units 44 and 45 are each movable to a "close" position on a predetermined optical path in the first area AR1 and an "open" position off the optical path, and shields light propagating on the optical path at the "close" position. In the example illustrated in FIG. 3, the "close" position is illustrated with a dashed line, and the "open" position is illustrated with a solid line. The light shielding units 44 and 45 may be each configured by, for example, a stage movable to the "close" position and the "open" position in accordance with a command from the control unit 14, a mirror disposed on the stage, and a beam damper configured to shield light reflected by the mirror at the "close" position. The stage may be moved by an air cylinder or by energization. The stage may automatically move to the "close" position at failure such as air leakage or breaking.

The "close" position of the light shielding unit 44 in the present embodiment is, for example, at a predetermined site between the beam combiner BC and the beam transmission optical system 35 on the optical path of the laser beam PL. Thus, the light shielding unit 44 can shield the laser beam PL emitted from the beam combiner BC. The "close" position of the light shielding unit 45 in the present embodiment is, for example, at a predetermined site between the optical path adjustment unit 34 and the beam transmission optical system 35 on the optical path of the laser beam ML. Thus, the light shielding unit 45 can shield the laser beam ML emitted from the optical path adjustment unit 34.

The extreme ultraviolet light generation system 103 of the embodiment includes a plurality of interlock switches S21 to S30 each configured to sense an operationally anomalous state of a light dimming unit or a light shielding unit in addition to the configuration of the extreme ultraviolet light generation system 102 of the comparative example.

The interlock switch S21 is provided at the "set" position of the light dimming unit 41, and the interlock switch S22 is provided at the "remove" position of the light dimming unit 41. The interlock switch S23 is provided at the "set" position of the light dimming unit 42, and the interlock switch S24 is provided at the "remove" position of the light dimming unit 42. The interlock switch S25 is provided at the "set" position of the light dimming unit 43, and the interlock switch S26 is provided at the "remove" position of the light dimming unit 43. The interlock switch S27 is provided at the "close" position of the light shielding unit 44, and the interlock switch S28 is provided at the "open" position of the light shielding unit 44. The interlock switch S29 is provided at the "close" position of the light shielding unit 45, and the interlock switch S30 is provided at the "open" position of the light shielding unit 45. The interlock switches S21 to S30 are each electrically connected with the control unit 14. For simplification of illustration, FIG. 3 omits a signal line connecting each of the interlock switches S21 to S30 and the control unit 14. The interlock switches S21 to S30 have identical configurations, and thus only the configuration of the interlock switch S21 will be described below.

The interlock switch S21 is in a normal contact point state when the light dimming unit 41 is positioned at the "set" position, or in an anomalous contact point state when the light dimming unit 41 is off the "set" position. The number of contact points of the interlock switch S21 may be equal to or larger than two. The interlock switch S21 outputs a sensing signal to the control unit 14 when the duration of the anomalous contact point state exceeds a predetermined duration. When the number of contact points is equal to or larger than two, the interlock switch S21 outputs the sensing signal to the control unit 14, for example, when the duration of the anomalous contact point state of each contact point exceeds the predetermined duration.

The control unit 14 of the extreme ultraviolet light generation system 103 of the embodiment is capable of performing switching among a normal mode, a light dimming mode, a light shielding mode, and a light dimming and shielding mode. The control unit 14 is disposed in the second area AR2 as described above, but may be disposed in the first area AR1 or may be disposed outside of the first area AR1 and the second area AR2.

4.2 Operation

Figure 4:
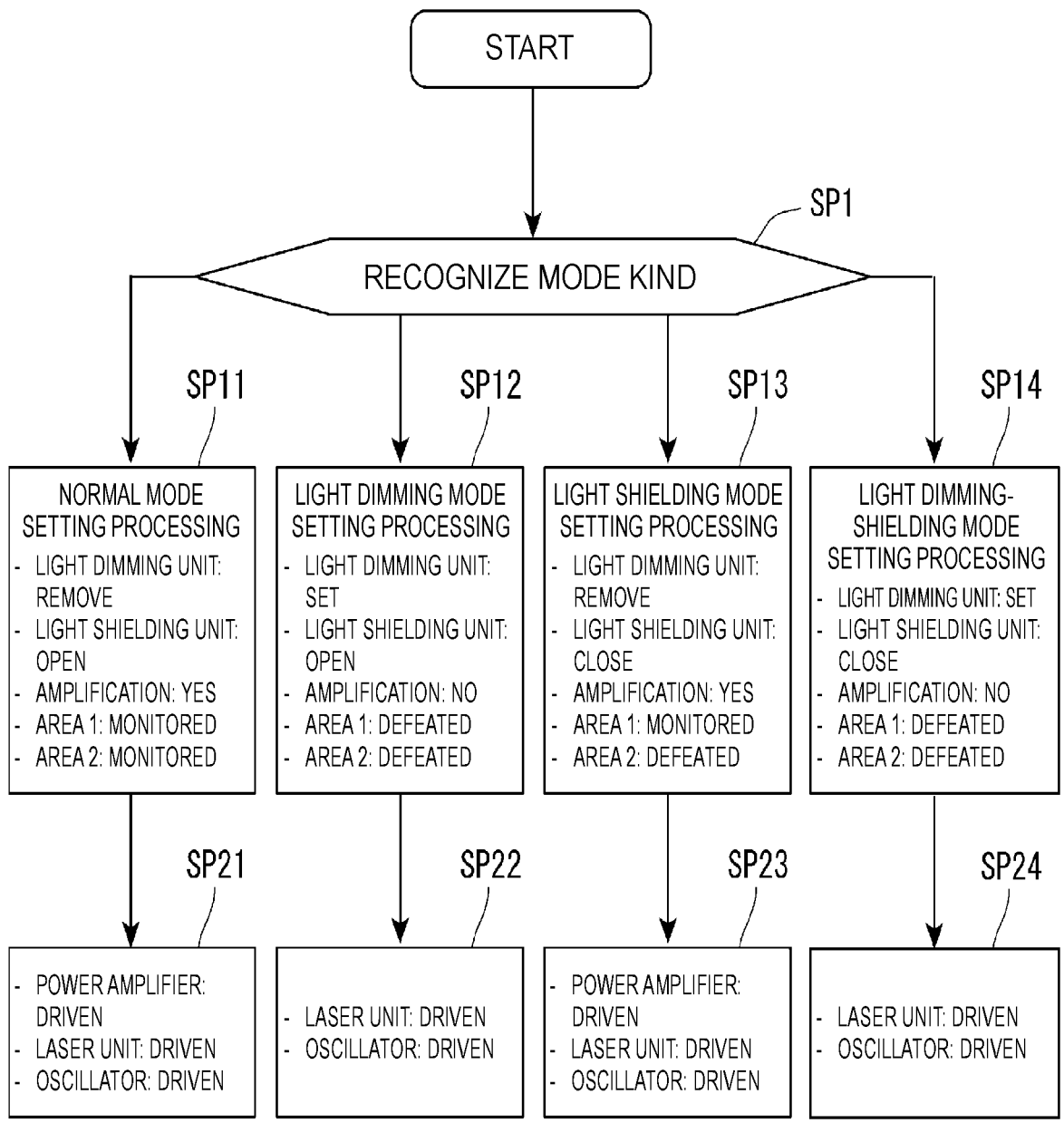
FIG. 4 is a flowchart illustrating a control processing routine executed by a control unit.

FIG. 4 is a flowchart illustrating a control processing routine performed by the control unit, and FIG. 5 is a table listing various mode states, exemplary maintenance work, and the like in the extreme ultraviolet light generation system.

As illustrated in FIG. 4, when having received a mode execution command from, for example, the operation input unit, the control unit 14 proceeds to step SP1. At step SP1, the control unit 14 recognizes the kind of a mode for which the execution command is received.

When the mode for which the execution command is received at step SP1 is the normal mode, the control unit 14 proceeds to step SP11. At step SP11, the control unit 14 acquires setting information of the normal mode. In the normal mode, as illustrated in FIG. 5, the disposition posi-tion of each of the light dimming units 41 to 43 is set to the "remove" position, and the disposition position of each of the light shielding units 44 and 45 is set to the "open" position. In the normal mode, monitoring of interlock switches in the first area AR1 and the second area AR2 is set to be activated, and the power amplifiers PA1 to PA4 are set to be driven. This setting information is stored in, for example, an internal memory of the control unit 14.

When having acquired the setting information of the normal mode, the control unit 14 sets each of the light dimming units 41 to 43 to the "remove" position and sets each of the light shielding units 44 and 45 to the "open" position based on the acquired setting information of the normal mode. In addition, the control unit 14 activates monitoring of the sensing signal output from each of the interlock switches S1 to S7 and S11 to S20 based on the acquired setting information, and then proceeds to step SP21.

At step SP21, the control unit 14 drives the power amplifiers PA1 to PA4, and then drives the first pre-pulse laser unit 31, the second pre-pulse laser unit 32, and the master oscillator 33 of the laser apparatus 2.

As described above, the light dimming units 41 and 42 each move to the "remove" position at step SP11. Thus, as illustrated in FIG. 3, the laser beam PL1 emitted from the first pre-pulse laser unit 31 and the laser beam PL2 emitted from the second pre-pulse laser unit 32 are incident on the beam combiner BC without being dimmed. In addition, as described above, the light shielding unit 44 moves to the "open" position at step SP11. Thus, as illustrated in FIG. 3, the laser beam PL including the laser beams PL1 and PL2 emitted from the beam combiner BC is incident on the beam transmission optical system 35 without being shielded.

In addition, as described above, the light dimming unit 43 moves to the "remove" position and the light shielding unit 45 moves to the "open" position at step SP11. In addition, the master oscillator 33 is driven after the power amplifiers PA1 to PA4 are driven. Thus, as illustrated in FIG. 3, the laser beam ML emitted from the master oscillator 33 is amplified by the power amplifiers PA1 to PA4 and incident on the beam transmission optical system 35 without being dimmed nor shielded.

The laser beam L including the laser beams PL and ML emitted from the beam transmission optical system 35 is output from the laser apparatus 2 in the first area AR1 and input to the extreme ultraviolet light generation device 1 disposed in the second area AR2 through the optical path tubes T7 and T8. The laser beam L input to the extreme ultraviolet light generation device 1 is condensed in the plasma generating region 21 of the chamber 11 as described above. Thus, as understood from the column of a simplified diagram of the normal mode in FIG. 5, the laser beam L at high power propagates from the first area AR1 to the second area AR2 in the normal mode.

In addition, the control unit 14 activates monitoring of the sensing signal output from each of the interlock switches S1 to S7 and S11 to S20 at step SP11. Thus, at step SP21, the control unit 14 stops the first pre-pulse laser unit 31, the second pre-pulse laser unit 32, and the master oscillator 33 upon detection of the sensing signal output from any of the interlock switches S1 to S7 and S11 to S20. Thus, in the normal mode, opening of each of the doors D1 to D7 and dismantlement of each of the optical path tubes T1 to T8 are prohibited in the first area AR1 and the second area AR2.

When the mode for which the execution command is received at step SP1 is the light dimming mode, the control unit 14 proceeds to step SP12. At step SP12, the control unit 14 acquires setting information of the light dimming mode. In the light dimming mode, as illustrated in FIG. 5, the disposition position of each of the light dimming units 41 to 43 is set to the "set" position, and the disposition position of each of the light shielding units 44 and 45 is set to the "open" position. In addition, in the light dimming mode, monitoring of interlock switches in the first area AR1 and the second area AR2 is set to be deactivated, and the power amplifiers PA1 to PA4 are set to be not driven. This setting information is stored in, for example, the internal memory of the control unit 14.

When having acquired the setting information of the light dimming mode, the control unit 14 sets each of the light dimming units 41 to 43 to the "set" position and sets each of the light shielding units 44 and 45 to the "open" position based on the acquired setting information of the light dimming mode. In addition, the control unit 14 deactivates monitoring of the sensing signal output from each of the interlock switches S1 to S7 and S11 to S20, and then proceeds to step SP22.

At step SP22, the control unit 14 drives the first pre-pulse laser unit 31, the second pre-pulse laser unit 32, and the master oscillator 33 of the laser apparatus 2 without driving the power amplifiers PA1 to PA4.

As described above, the light dimming units 41 and 42 each move to the "set" position at step SP12. Thus, as illustrated in FIG. 3, the laser beam PL1 emitted from the first pre-pulse laser unit 31 and the laser beam PL2 emitted from the second pre-pulse laser unit 32 are dimmed and then incident on the beam combiner BC. In addition, as described above, the light shielding unit 44 moves to the "open" position at step SP12. Thus, the laser beam PL including the laser beams PL1 and PL2 emitted from the beam combiner BC is incident on the beam transmission optical system 35 without being shielded.

In addition, as described above, the light dimming unit 43 moves to the "set" position and the light shielding unit 45 moves to the "open" position at step SP12. In addition, the master oscillator 33 is driven while the power amplifiers PA1 to PA4 are not driven. Thus, the laser beam ML emitted from the master oscillator 33 is dimmed by the light dimming unit 43 without being amplified by the power amplifiers PA1 to PA4, and then incident on the beam transmission optical system 35 without being shielded.

The laser beam L including the laser beams PL and ML emitted from the beam transmission optical system 35 is output from the laser apparatus 2 in the first area AR1 and input to the extreme ultraviolet light generation device 1 disposed in the second area AR2 through the optical path tubes T7 and T8. The laser beam L input to the extreme ultraviolet light generation device 1 is condensed in the plasma generating region 21 of the chamber 11 as described above. Thus, as understood from the column of a simplified diagram of the light dimming mode in FIG. 5, the laser beam L at low power propagates from the first area AR1 to the second area AR2 in the light dimming mode.

In addition, the control unit 14 deactivates monitoring of the sensing signal output from each of the interlock switches S1 to S7 and S11 to S20 at step SP12. Thus, at step SP22, the control unit 14 keeps driving the first pre-pulse laser unit 31, the second pre-pulse laser unit 32, and the master oscillator 33 even upon detection of the sensing signal output from any of the interlock switches S1 to S7 and S11 to S20. In this manner, in the light dimming mode, opening of each of the doors D1 to D7 and dismantlement of each of the optical path tubes T1 to T8 are permitted in the first area AR1 and the second area AR2.

When the mode for which the execution command is received at step SP1 is the light shielding mode, the control unit 14 proceeds to step SP13. At step SP13, the control unit 14 acquires setting information of the light shielding mode. In the light shielding mode, as illustrated in FIG. 5, the disposition position of each of the light dimming units 41 to 43 is set to the "remove" position, and the disposition position of each of the light shielding units 44 and 45 is set to the "close" position. In addition, in the light shielding mode, monitoring of interlock switches provided upstream of the "close" position in the traveling direction of the laser beam L among interlock switches in the first area AR1 is set to be activated. However, monitoring of all interlock switches in the first area AR1 may be set to be activated. In addition, in the light shielding mode, monitoring of interlock switches in the second area AR2 is set to be deactivated. In addition, in the light shielding mode, the power amplifiers are set to be driven. This setting information is stored in, for example, the internal memory of the control unit 14.

When having acquired the setting information of the light shielding mode, the control unit 14 sets each of the light dimming units 41 to 43 to the "remove" position and sets each of the light shielding units 44 and 45 to the "close" position based on the acquired setting information of the light shielding mode. In addition, the control unit 14 activates monitoring of the sensing signal output from each of the interlock switches S3 to S7, S13 to S16, S18, and S20 in the first area AR1. In addition, the control unit 14 deactivates monitoring of the sensing signal output from each of the interlock switches S1, S11, S12, S17, and S19 provided in the second area AR2, and then proceeds to step SP23.

At step SP23, the control unit 14 drives the power amplifiers PA1 to PA4, and then drives the first pre-pulse laser unit 31, the second pre-pulse laser unit 32, and the master oscillator 33 of the laser apparatus 2.

As described above, the light dimming units 41 and 42 each move to the "remove" position at step SP13. Thus, as illustrated in FIG. 3, the laser beam PL1 emitted from the first pre-pulse laser unit 31 and the laser beam PL2 emitted from the second pre-pulse laser unit 32 are incident on the beam combiner BC without being dimmed. In addition, as described above, the light shielding unit 44 moves to the "close" position at step SP13. Thus, the laser beam PL including the laser beams PL1 and PL2 emitted from the beam combiner BC is shielded by the light shielding unit 44.

In addition, as described above, the light dimming unit 43 moves to the "remove" position and the light shielding unit 45 moves to the "close" position at step SP13. In addition, the master oscillator 33 is driven after the power amplifiers PA1 to PA4 are driven. Thus, the laser beam ML emitted from the master oscillator 33 is amplified by the power amplifiers PA1 to PA4, passes through the optical path adjustment unit 34 without being dimmed by the light dimming unit 43, and then is shielded by the light shielding unit 44. Thus, as understood from the column of a simplified diagram of the light shielding mode in FIG. 5, the laser beam L at high power propagates only between the oscillation source of the laser beam L and each of the light shielding units 44 and 45 set to the "close" position in the first area AR1 in the light shielding mode.

In addition, the control unit 14 activates only monitoring of the interlock switches S3 to S7, S13 to S16, S18, and S20 in the first area AR1 at step SP13. Thus, at step SP23, the control unit 14 stops the first pre-pulse laser unit 31, the second pre-pulse laser unit 32, and the master oscillator 33 upon detection of the sensing signal output from any one of the interlock switches set as monitoring targets in the first area AR1. However, the control unit 14 keeps driving the first pre-pulse laser unit 31, the second pre-pulse laser unit 32, and the master oscillator 33 even upon detection of the sensing signal output from any interlock switch provided in the second area AR2. In this manner, only opening of the door D2 in the first area AR1, opening of the door D1 in the second area AR2, dismantlement of the optical path tubes T1 and T2, and dismantlement of end parts of the optical path tubes T7 and T8 on the second area AR2 side are permitted in the light shielding mode.

When the mode for which the execution command is received at step SP1 is the light dimming and shielding mode, the control unit 14 proceeds to step SP14. At step SP14, the control unit 14 acquires setting information of the light dimming and shielding mode. In the light dimming and shielding mode, the disposition position of each of the light dimming units 41 to 43 are each set to the "set" position and the disposition position of each of the light shielding units 44 and 45 are each set to the "close" position as illustrated in FIG. 5. In addition, in the light dimming and shielding mode, monitoring of interlock switches in the first area AR1 and the second area AR2 is set to be deactivated, and the power amplifiers are set not to be driven. This setting information is stored in, for example, the internal memory of the control unit 14.

When having acquired the setting information of the light dimming and shielding mode, the control unit 14 sets each of the light dimming units 41 to 43 to the "set" position and sets each of the light shielding units 44 and 45 to the "close" position based on the acquired setting information of the light dimming and shielding mode. In addition, the control unit 14 deactivates monitoring of the sensing signal output from each of the interlock switches S1 to S7 and S11 to S20, and then proceeds to step SP24.

At step SP24, the control unit 14 drives the first pre-pulse laser unit 31, the second pre-pulse laser unit 32, and the master oscillator 33 of the laser apparatus 2 without driving the power amplifiers PA1 to PA4.

As described above, the light dimming units 41 and 42 each move to the "set" position at step SP14. Thus, as illustrated in FIG. 3, the laser beam PL1 emitted from the first pre-pulse laser unit 31 and the laser beam PL2 emitted from the second pre-pulse laser unit 32 are dimmed and then incident on the beam combiner BC. In addition, as described above, the light shielding unit 44 moves to the "close" position at step SP14. Thus, the laser beam PL including the laser beams PL1 and PL2 emitted from the beam combiner BC is shielded by the light shielding unit 44.

In addition, as described above, the light dimming unit 43 moves to the "set" position and the light shielding unit 45 moves to the "close" position at step SP14. In addition, the master oscillator 33 is driven while the power amplifiers PA1 to PA4 are not driven. Thus, the laser beam ML emitted from the master oscillator 33 is dimmed by the light dimming unit 43 without being amplified by the power amplifiers PA1 to PA4, passes through the optical path adjustment unit 34, and then is shielded by the light shielding unit 44. Thus, as understood from the column of a simplified diagram of the light dimming and shielding mode in FIG. 5, the laser beam L at low power propagates only between the oscillation source of the laser beam L and each of the light shielding units 44 and 45 set to the "close" position in the first area AR1 in the light dimming and shielding mode.

In addition, the control unit 14 deactivates monitoring of the sensing signal output from each of the interlock switches S1 to S7 and S11 to S20 at step SP14. Thus, at step SP24, the control unit 14 keeps driving the first pre-pulse laser unit 31, the second pre-pulse laser unit 32, and the master oscillator 33 even upon detection of the sensing signal output from any of the interlock switches S1 to S7 and S11 to S20. In this manner, in the light dimming and shielding mode, opening of each of the doors D1 to D7 and dismantlement of each of the optical path tubes T1 to T8 are permitted in the first area AR1 and the second area AR2.

The following describes specific setting processing routines of setting the positions of the light dimming units 41 to 43 and the light shielding units 44 and 45 and activating and deactivating monitoring of the sensing signal output at the above-described steps SP11 to SP14. However, the set positions of the light dimming units 41 to 43 and the light shielding units 44 and 45 and the kind of monitoring of the sensing signal output are different between the setting processing routines at steps SP11 to SP14, but the setting processing routines have the same content. Thus, the following description is only made with the setting processing routine at step SP12.

FIG. 6 is a flowchart illustrating the setting processing routine. As illustrated in FIG. 6, when having acquired the setting information of the light dimming mode at step SP12, the control unit 14 starts the setting processing routine and then proceeds to step SP31.

At step SP31, the control unit 14 recognizes based on the setting information of the light dimming mode acquired at step SP12 that the set position of each of the light dimming units 41 to 43 is the "set" position and the set position of each of the light shielding units 44 and 45 is the "open" position. Then, the control unit 14 provides a move command for movement to the "set" position to each of the light dimming units 41 to 43 and provides a move command for movement to the "open" position to each of the light shielding units 44 and 45, and then proceeds to step SP32.

At step SP32, the control unit 14 determines whether each command target to which the move command is provided at step SP31 has completed the movement in an allowed time after the move command is provided. For example, the control unit 14 monitors the sensing signals output from the interlock switches S21 to S26 provided at the "set" positions and the "remove" positions of the light dimming units 41 to 43, and monitors the sensing signals output from the interlock switches S27 to S30 provided at the "close" positions and the "open" positions of the light shielding units 44 and 45. Then, the control unit 14 detects any interlock switch having output the sensing signal in the allowed time after the move command is provided, thereby determining whether the movement has been completed in the allowed time. A polling communication scheme in which a query signal is transmitted to each command target, and a response signal to the query signal is received from the command target may be used in place of the interlock switches S21 to S30. In this manner as well, it can be determined whether each command target has completed the movement in the allowed time after the move command is provided. The allowed time is, for example, 10 seconds approximately.

When every command target to which the move command is provided at step SP31 has completed the movement in the allowed time, the control unit 14 proceeds to step SP33. At step SP33, the control unit 14 deactivates monitoring of the sensing signal output from each of the interlock switches S1 to S7 and S11 to S20 based on the setting information of the light dimming mode acquired at step SP12. Thereafter, the control unit 14 proceeds to step SP23 described above.

When any command target to which the move command is provided at step SP31 has not completed the movement in the allowed time, operation anomaly such as failure potentially occurs at the command target. In this case, the control unit 14 proceeds to step SP34. At step SP34, the control unit 14 issues an alert that operation anomaly potentially occurs. Thereafter, the control unit 14 ends the control processing routine without proceeding to step SP23 described above. Specifically, when having transmitted an alert that operation anomaly potentially occurs, the control unit 14 does not drive but keeps stopping the first pre-pulse laser unit 31, the second pre-pulse laser unit 32, and the master oscillator 33.

Figure 7:
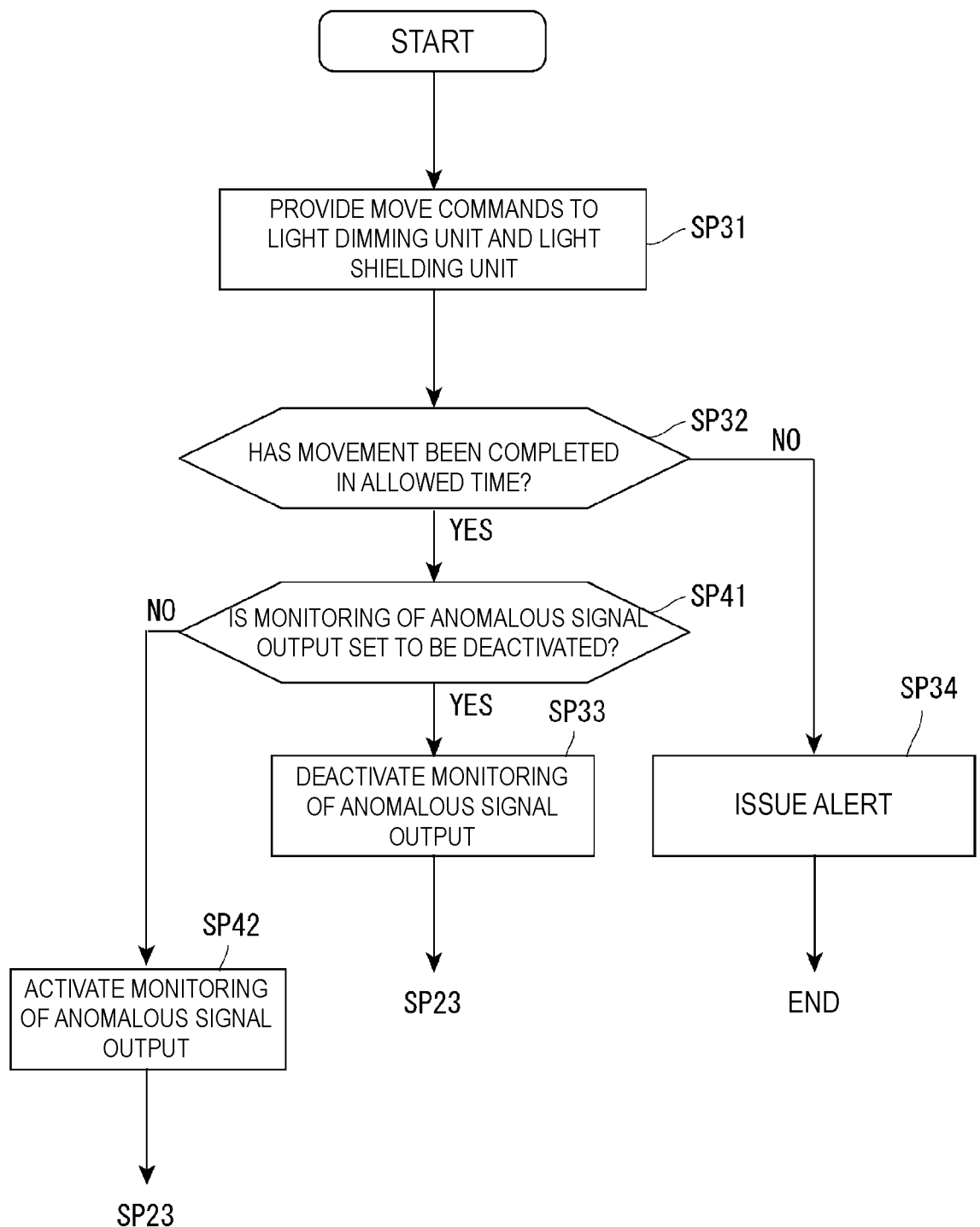
FIG. 7 is a flowchart illustrating another setting processing routine.

When monitoring of the sensing signal output is set to be deactivated, a new step SP41 at which an operator can input whether to perform this setting may be provided between steps SP31 and SP33 as illustrated in FIG. 7.

At step SP41, the control unit 14 displays, on a display device, for example, a confirmation message for deactivation of monitoring of the sensing signal output and waits for inputting of whether to deactivate monitoring of the sensing signal output. A device for this inputting may be, for example, a physical switch provided in the first area AR1 or the second area AR2, or may be a button on a display screen of the display device. When the operator performs inputting for deactivating monitoring of the sensing signal output, the control unit 14 proceeds to step SP33 described above. When the operator performs inputting for not deactivating monitoring of the sensing signal output, the control unit 14 proceeds to step SP42 and activates monitoring of the sensing signal output. In this manner, the operator directly inputs whether to deactivate the monitoring, and thus can avoid unintended deactivation of the monitoring.

4.3 Effect

As described above, the extreme ultraviolet light generation system 103 of the embodiment includes the first area AR1 and the second area AR2. The first area AR1 includes the optical path adjustment unit 34 configured to adjust the optical path of the laser beam ML emitted from the master oscillator 33, and the first interlock switches S2 to S7, S13 to S16, S18, and S20. The second area AR2 includes the chamber 11 having inside the plasma generating region 21 in which EUV light is generated from plasma of the target substance to be irradiated with the laser beam ML, and the second interlock switches S1, S11, S12, S17, and S19.

The extreme ultraviolet light generation system 103 of the embodiment includes the control unit 14. In the present embodiment, the control unit 14 is included in the second area AR2, but may be included in the first area AR1 as described above or may be disposed outside of the first area AR1 and the second area AR2.

As illustrated in FIG. 5, the control unit 14 is capable of performing switching among the normal mode as a first setting state, the light dimming mode as a second setting state, and the light shielding mode as a third setting state.

In the normal mode, monitoring of signals output from the first interlock switches S2 to S7, S13 to S16, S18, and S20 and monitoring of signals output from the second interlock switches S1, S11, S12, S17, and S19 are both activated. In the normal mode, monitoring of the interlock switches S1 to S7 and S11 to S20 in the first area AR1 and the second area AR2 is activated. Accordingly, in the normal mode, the extreme ultraviolet light generation system 103 provides a work environment in which work can be performed without entering any of the first area AR1 and the second area AR2.

In the light dimming mode, monitoring of signals output from the first interlock switches S2 to S7, S13 to S16, S18, and S20 and monitoring of signals output from the second interlock switches S1, S11, S12, S17, and S19 are both deactivated. In the light dimming mode, monitoring of the interlock switches S1 to S7 and S11 to S20 in the first area AR1 and the second area AR2 is deactivated. Accordingly, in the light dimming mode, the extreme ultraviolet light generation system 103 provides a work environment in which work can be performed in both of the first area AR1 and the second area AR2.

In the light shielding mode, monitoring of signals output from the first interlock switches S3 to S7, S13 to S16, S18, and S20 is activated, and monitoring of signals output from the second interlock switches S1, S11, S12, S17, and S19 is deactivated. In the light shielding mode, at least monitoring of the interlock switches S1, S11, S12, S17, and S19 in the second area AR2 is deactivated. Accordingly, in the light shielding mode, the extreme ultraviolet light generation system 103 provides a work environment in which work can be performed in the second area AR2 without entering the first area AR1.

In this manner, since the extreme ultraviolet light generation system 103 includes the control unit 14 capable of performing switching among the normal mode, the light dimming mode, and the light shielding mode, the extreme ultraviolet light generation system 103 can provide work environments in which different kinds of work can be performed. The extreme ultraviolet light generation system 103 may switch the normal mode, the light dimming mode, and the light shielding mode in accordance with the kind of work. Accordingly, the extreme ultraviolet light generation system 103 that allows various kinds of work to be performed is provided.

The first area AR1 of the present embodiment further includes the light dimming unit 43. The light dimming unit 43 is movable to the predetermined "set" position on a side on which the laser beam ML is incident on the optical path adjustment unit 34 on the optical path of the laser beam ML and to the "remove" position off the optical path, and dims the laser beam ML at the "set" position.

Thus, when the light dimming unit 43 is at the "set" position, the laser beam ML at low power dimmed by the light dimming unit 43 is incident on the optical path adjustment unit 34. Thus, when monitoring of the first interlock switches S2 to S7, S13 to S16, S18, and S20 in the first area AR1 is deactivated, the optical axis of the laser beam ML incident in the plasma generating region 21 can be adjusted by using the optical path adjustment unit 34 in the first area AR1.

The first area AR1 further includes the light shielding unit 45. The light shielding unit 45 is movable to the predetermined "close" position on a side on which the laser beam ML is emitted to the optical path adjustment unit 34 on the optical path of the laser beam ML and to the "open" position off the optical path, and shields the laser beam ML at the "close" position.

Thus, when the light shielding unit 45 is at the "close" position, the laser beam ML is shielded in the first area AR1 by the light shielding unit 45 and not incident in the second area AR2. Thus, when monitoring of the interlock switches S1, S11, S12, S17, and S19 in the second area AR2 is deactivated, work such as maintenance of the chamber 11 can be performed in the second area AR2.

In the normal mode of the present embodiment, the light dimming unit 43 is set to the "remove" position, and the light shielding unit 45 is set to the "open" position.

Thus, in the normal mode, the laser beam ML is incident in the plasma generating region 21 in the chamber 11 without being dimmed nor shielded. As described above, in the normal mode, monitoring of the interlock switches S1 to S7 and S11 to S20 in the first area AR1 and the second area AR2 is activated. Thus, the extreme ultraviolet light generation system 103 can provide a work environment in which work such as EUV light emission, plasma point output measurement, laser output measurement, spot barycenter position adjustment, or control characteristic adjustment is performed as illustrated with the exemplary work in FIG. 5.

The EUV light emission is irradiation of the droplet DL with the laser beam ML. The plasma point output measurement is measurement of the power of light radiated in the plasma generating region 21 by using a measurement instrument provided in the chamber 11, and the laser output measurement is measurement of the power of the laser beam L incident in the chamber 11 by using the measurement instrument. The spot barycenter position adjustment is adjustment of the stage ST so that the focusing position of the laser condensation optical system 22 is positioned at a target position. The control characteristic adjustment is adjustment for having desired control performed by a control system including the control unit 14.

In the light dimming mode of the present embodiment, the light dimming unit 43 is set to the "set" position, and the light shielding unit 45 is set to the "open" position.

Thus, in the light dimming mode, the laser beam ML at low power dimmed by the light dimming unit 43 is incident in the plasma generating region 21 of the chamber 11 in the second area AR2 through the optical path adjustment unit 34. As described above, monitoring of the interlock switches S1 to S7 and S11 to S20 in the first area AR1 and the second area AR2 is deactivated in the light dimming mode. Thus, the extreme ultraviolet light generation system 103 can provide a work environment in which the optical axis of the laser beam ML incident in the plasma generating region 21 is adjusted by using the optical path adjustment unit 34 as illustrated with the exemplary work in FIG. 5.

In the light shielding mode of the present embodiment, the light dimming unit 43 is set to the "remove" position, and the light shielding unit 45 is set to the "close" position.

Thus, in the light shielding mode, the laser beam ML is shielded in the first area AR1 by the light shielding unit 45 and not incident in the second area AR2. As described above, at least monitoring of the interlock switches S1, S11, S12, S17, and S19 in the second area AR2 is deactivated in the light shielding mode. Thus, the extreme ultraviolet light generation system 103 can provide a work environment in which work such as maintenance of the chamber 11 is performed in the second area AR2 and work such as power measurement of the laser beam ML is performed in the first area AR1. In the work environment, different works can be simultaneously performed individually in the first area AR1 and the second area AR2, which leads to improved efficiency of the works.

The control unit 14 of the present embodiment is capable of performing switching among the normal mode, the light dimming mode, the light shielding mode, and the light dimming and shielding mode as another second setting state described above. In the light dimming and shielding mode, the light dimming unit 43 is set to the "set" position, and the light shielding unit 45 is set to the "close" position.

The light dimming and shielding mode is combination of the light dimming mode and the light shielding mode described above. Thus, as described above, a work environment can be provided in which work such as maintenance of the chamber 11 is performed in the second area AR2, and the optical axis of the laser beam ML incident in the plasma generating region 21 is adjusted by using the optical path adjustment unit 34 in the first area AR1.

As described with reference to FIG. 6, the control unit 14 of the present embodiment provides a move command to at least one of the light dimming unit 43 and the light shielding unit 45 as a command target, and stops the master oscillator 33 when the command target has not completed the movement in an allowed time after the move command is provided.

In the present embodiment, whether the command target has completed the movement in the allowed time after the move command is provides is determined by using interlock switches, not by the polling communication scheme. Specifically, in the present embodiment, the first area AR1 includes the light-dimming-unit interlock switches S25 and S26 each configured to output the sensing signal upon sensing of the operationally anomalous state of the light dimming unit 43. In addition, the first area AR1 includes the light-shielding-unit interlock switches S29 and S30 each configured to output the sensing signal upon sensing of the operationally anomalous state of the light shielding unit 45. The control unit 14 stops the master oscillator 33 when the sensing signal is output from at least one of the light dimming unit 43 and the light shielding unit 45 as command targets.

In this case, it is possible to avoid the occurrence of such a contingent situation that the laser beam ML to be dimmed by the light dimming unit 43 is not dimmed or the laser beam ML to be shielded by the light shielding unit 45 is not shielded.

As described with reference to FIG. 7, when monitoring of the sensing signal output is set to be deactivated, the control unit 14 of the present embodiment displays a confirmation message on the display device before the setting, and waits for inputting of whether to deactivate monitoring of the sensing signal output.

In this manner, the operator directly inputs whether to deactivate the monitoring, and thus can avoid unintended deactivation of the monitoring.

In the present embodiment, the first area AR1 further includes the power amplifiers PA1 to PA4. The power amplifiers PA1 to PA4 are provided between the light dimming unit 43 and the master oscillator 33, and driven in the normal mode and the light shielding mode or stopped in the light dimming mode.

In the light dimming mode, since the optical axis of the laser beam ML incident in the plasma generating region 21 can be adjusted by using the optical path adjustment unit 34 as described above, the power amplifiers PA1 to PA4 are preferably stopped. However, the power amplifiers PA1 to PA4 do not necessarily need to be stopped when the intensity of the laser beam ML at incidence on the light dimming unit 43 in the light dimming mode is lower than that in the normal mode. For example, only some of the power amplifiers PA1 to PA4 may be stopped, or each of the power amplifiers PA1 to PA4 may perform amplification at an amplification degree smaller than that in the normal mode. Alternatively, the master oscillator 33 may emit the laser beam ML at an intensity lower than that in the normal mode. In the light dimming mode, the light dimming unit 43 may be positioned at the "remove" position when the intensity of the laser beam ML at incidence on the light dimming unit 43 is lower than that in the normal mode.

The above description is intended to provide not restriction but examples. Thus, the skilled person in the art would clearly understand that the embodiments of the present disclosure may be changed without departing from the scope of the claims.

The terms used throughout the specification and the appended claims should be interpreted as "non-limiting". For example, the term "comprising" or "comprised" should be interpreted as "not limited to what has been described as being comprised". The term "having" should be interpreted as "not limited to what has been described as having". It should be understood that the indefinite article "a" in the present specification and the claims means "at least one" or "one or more".

What is claimed is:

1. An extreme ultraviolet light generation system comprising:
    a first area including an optical path adjustment unit configured to adjust an optical path of a laser beam emitted from an oscillator;
    a second area including a chamber having inside a plasma generating region in which extreme ultraviolet light is generated from plasma of a target substance irradiated with the laser beam;
    a first interlock switch disposed in the first area and configured to sense the state of a sensing object in the first area;
    a second interlock switch disposed in the second area and configured to sense the state of a sensing object in the second area; and
    a control unit capable of performing switching among a first setting state in which monitoring of a sensing signal output from the first interlock switch and monitoring of a sensing signal output from the second interlock switch are both activated, a second setting state in which monitoring of a sensing signal output from the first interlock switch and monitoring of a sensing signal output from the second interlock switch are both deactivated, and a third setting state in which monitoring of a sensing signal output from the first interlock switch is activated and monitoring of a sensing signal output from the second interlock switch is deactivated.

2. The extreme ultraviolet light generation system according to claim 1, wherein
    the first area further includes a light dimming unit, and
    the light dimming unit is movable to a predetermined "set" position on a side on which the laser beam is incident on the optical path adjustment unit on the optical path of the laser beam and to a "remove" position off the optical path, and dims the laser beam at the "set" position.

3. The extreme ultraviolet light generation system according to claim 2, wherein
    the first area further includes a light shielding unit, and
    the light shielding unit is movable to a predetermined "close" position on a side on which the laser beam is emitted to the optical path adjustment unit on the optical path of the laser beam and to an "open" position off the optical path, and shields the laser beam at the "close" position.

4. The extreme ultraviolet light generation system according to claim 3, wherein, in the first setting state, the light dimming unit is set to the "remove" position, and the light shielding unit is set to the "open" position.

5. The extreme ultraviolet light generation system according to claim 3, wherein, in the second setting state, the light dimming unit is set to the "set" position, and the light shielding unit is set to the "open" position.

6. The extreme ultraviolet light generation system according to claim 3, wherein, in the second setting state, the light dimming unit is set to the "set" position, and the light shielding unit is set to the "close" position.

7. The extreme ultraviolet light generation system according to claim 3, wherein, in the third setting state, the light dimming unit is set to the "remove" position, and the light shielding unit is set to the "close" position.

8. The extreme ultraviolet light generation system according to claim 3, wherein
    the first interlock switch is disposed each of upstream and downstream of the "close" position of the light shielding unit in a traveling direction of the laser beam, and
    when the light shielding unit is set to the "close" position, the control unit activates monitoring of the first interlock switch provided upstream of the "close" position and deactivates monitoring of the first interlock switch provided downstream of the "close" position.

9. The extreme ultraviolet light generation system according to claim 3, wherein the control unit provides a move command to at least one of the light dimming unit and the light shielding unit as a command target, and stops the oscillator when the command target has not completed movement in an allowed time after the provision of the move command.

10. The extreme ultraviolet light generation system according to claim 9, wherein
    the first interlock switch includes a light-dimming-unit interlock switch configured to output the sensing signal upon sensing of an operationally anomalous state of the light dimming unit, and a light-shielding-unit interlock switch configured to output the sensing signal upon sensing of an operationally anomalous state of the light shielding unit, and
    the control unit stops the oscillator when the sensing signal is output from the command target in the allowed time.

11. The extreme ultraviolet light generation system according to claim 3, wherein the first area is provided between the light dimming unit and the oscillator and further includes a power amplifier configured to amplify the laser beam emitted from the oscillator.

12. The extreme ultraviolet light generation system according to claim 11, wherein
    the power amplifier is driven in the first setting state and the third setting state, and
    intensity of a laser beam incident on the light dimming unit in the second setting state is smaller than the intensity of the laser beam in the first setting state and the third setting state.

13. The extreme ultraviolet light generation system according to claim 12, wherein the power amplifier is stopped in the second setting state.

14. The extreme ultraviolet light generation system according to claim 13, wherein
    the first area includes a first housing in which the oscillator and the optical path adjustment unit are housed, a second housing in which the power amplifier is housed, and an optical path tube of the laser beam, the optical path tube being coupled with the first housing and the second housing,
    the first interlock switch includes an optical-path-tube interlock switch configured to output the sensing signal upon sensing of dismantlement of the optical path tube, and
    the control unit stops the oscillator upon detection of the sensing signal when monitoring of the sensing signal output from the optical-path-tube interlock switch is activated.

15. The extreme ultraviolet light generation system according to claim 14, wherein
the first interlock switch includes a door interlock switch configured to output the sensing signal upon sensing of opening of a door of the housing, and
the control unit stops the oscillator upon detection of the sensing signal when monitoring of the sensing signal output from the door interlock switch is activated.

16. The extreme ultraviolet light generation system according to claim 1, wherein, when the monitoring is set to be deactivated, the control unit displays a confirmation message on a display device before the setting and waits for inputting of whether to deactivate the monitoring.

17. The extreme ultraviolet light generation system according to claim 1, wherein the first area further includes a first beam transmission system through which the laser beam emitted from the optical path adjustment unit is transmitted to the second area.

18. The extreme ultraviolet light generation system according to claim 17, wherein the second area further includes a second beam transmission system through which the laser beam incident in the second area from the first area is transmitted to the chamber.

19. The extreme ultraviolet light generation system according to claim 1, further comprising an optical path tube disposed across the first area and the second area.

20. The extreme ultraviolet light generation system according to claim 19, wherein the first interlock switch is provided on a side of the first area on the optical path tube, and the second interlock switch is provided on a side of the second area on the optical path tube.

* * * * *